US011152959B2

(12) United States Patent
Hui et al.

(10) Patent No.: US 11,152,959 B2
(45) Date of Patent: *Oct. 19, 2021

(54) ENHANCED INFORMATION SEQUENCES FOR POLAR CODES

(71) Applicant: Telefonaktiebolaget LM Ericsson (publ), Stockholm (SE)

(72) Inventors: Dennis Hui, Sunnyvale, CA (US); Leefke Grosjean, Täby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 5 days.

This patent is subject to a terminal disclaimer.

(21) Appl. No.: 16/630,039

(22) PCT Filed: Jul. 11, 2018

(86) PCT No.: PCT/IB2018/055127
§ 371 (c)(1),
(2) Date: Jan. 10, 2020

(87) PCT Pub. No.: WO2019/012457
PCT Pub. Date: Jan. 17, 2019

(65) Prior Publication Data
US 2021/0111739 A1    Apr. 15, 2021

Related U.S. Application Data

(60) Provisional application No. 62/531,723, filed on Jul. 12, 2017.

(51) Int. Cl.
*H03M 13/13* (2006.01)
*H03M 13/39* (2006.01)

(52) U.S. Cl.
CPC ....... *H03M 13/13* (2013.01); *H03M 13/3977* (2013.01)

(58) Field of Classification Search
CPC ..................................................... H03M 13/13
See application file for complete search history.

(56) References Cited

U.S. PATENT DOCUMENTS 10,243,592 B2 *  3/2019  Li ....................... H03M 13/616
2017/0047947 A1   2/2017  Hong et al.
(Continued)

FOREIGN PATENT DOCUMENTS

WO       2017106246 A2    6/2017

OTHER PUBLICATIONS

Arikan, Erdal, "Channel Polarization: A Method for Constructing Capacity-Achieving Codes for Symmetric Binary-Input Memoryless Channels," IEEE Transactions on Information Theory, vol. 55, No. 7, Jul. 2009, pp. 3051-3073.
(Continued)

*Primary Examiner* — Joseph D Torres
(74) *Attorney, Agent, or Firm* — Withrow & Terranova, PLLC (57) ABSTRACT

Systems and methods are disclosed for performing polar encoding of a number of information bits for transmission in a wireless communication system in a manner that is optimized for a specific code length. In some embodiments, a method of operation of a transmit node in a wireless communication system comprises performing polar encoding of a set of K information bits to thereby generate a set of polar-encoded information bits where the K information bits are mapped to the first K information bit locations specified in an information sequence $S_N$ which is a ranked sequence of N information bit locations among a plurality of input bits for the polar encoding where N is equivalent to a code length, a size of the information sequence $S_N$ is greater than or equal to K, and the information sequence SN is optimized for a specific value of the code length N.

13 Claims, 8 Drawing Sheets

(56) References Cited

U.S. PATENT DOCUMENTS

| | | | |
|---|---|---|---|
| 2020/0220560 A1* | 7/2020 | Hui | H03M 13/13 |
| 2020/0235754 A1* | 7/2020 | Hui | H04L 1/0041 |
| 2020/0235852 A1* | 7/2020 | Hui | H03M 13/13 |

OTHER PUBLICATIONS

Huawei, et al., "R1-167209: Polar code design and rate matching," Third Generation Partnership Project (3GPP), TSG RAN WG1 Meeting #86, Aug. 22-26, 2016, 5 pages, Gothenburg, Sweden.

Leroux, Camille, et al., "A Semi-Parallel Successive-Cancellation Decoder for Polar Codes," IEEE Transactions on Signal Processing, vol. 61, No. 2, Jan. 15, 2013, 10 pages.

Qualcomm Incorporated, "R1-1709178: FRANK polar construction for NR control channel and performance comparison," Third Generation Partnership Project (3GPP), TSG-RAN WG1 #89, May 15-19, 2017, 27 pages, Hangzhou, P R. China.

Qualcomm Incorporated, "R1-1711218: Sequence construction of Polar codes for control channel," Third Generation Partnership Project (3GPP), TSG-RAN WG1 NR Ad-Hoc#2, Jun. 27-30, 2017, 17 pages, Qingdao, P.R. China.

Qualcomm Incorporated, "R1-1713468: Sequence construction of Polar codes for control channel," Third Generation Partnership Project (3GPP), TSG-RAN WG1 #90, Aug. 21-25, 2017, 15 pages, Prague, Czech Republic.

Tal, Ido, et al., "List Decoding of Polar Codes," IEEE International Symposium on Information Theory Proceedings, St. Petersburg, 2011, pp. 1-5.

International Search Report and Written Opinion for International Patent Application No. PCT/IB2018/055127, dated Oct. 31, 2018, 17 pages.

Examination Report for European Patent Application No. 18752277.6, dated Nov. 5, 2020, 7 pages.

* cited by examiner

FIG. 9

ENHANCED INFORMATION SEQUENCES FOR POLAR CODES

RELATED APPLICATIONS

This application is a 35 U.S.C. § 371 national phase filing of International Application No. PCT/162018/055127, filed Jul. 11, 2018, which claims the benefit of provisional patent application Ser. No. 62/531,723, filed Jul. 12, 2017, the disclosures of which are hereby incorporated herein by reference in their entireties.

TECHNICAL FIELD

The present disclosure relates to polar encoding.

BACKGROUND

Polar codes, proposed by Arikan [1], are the first class of constructive coding schemes that are provable to achieve the symmetric capacity of the binary-input discrete memoryless channels under a low-complexity Successive Cancellation (SC) decoder. However, the finite-length performance of polar codes under SC is not competitive compared to other modern channel coding schemes such as Low-Density Parity-Check (LDPC) codes and Turbo codes. Later, SC List (SCL) decoder is proposed in [2], which can approach the performance of optimal Maximum-Likelihood (ML) decoder. By concatenating a simple Cyclic Redundancy Check (CRC) coding, it was shown that the performance of concatenated polar code is competitive with that of well-optimized LDPC and Turbo codes. As a result, polar codes are being considered as a candidate for future Fifth Generation (5G) wireless communication systems.

Figure 1:
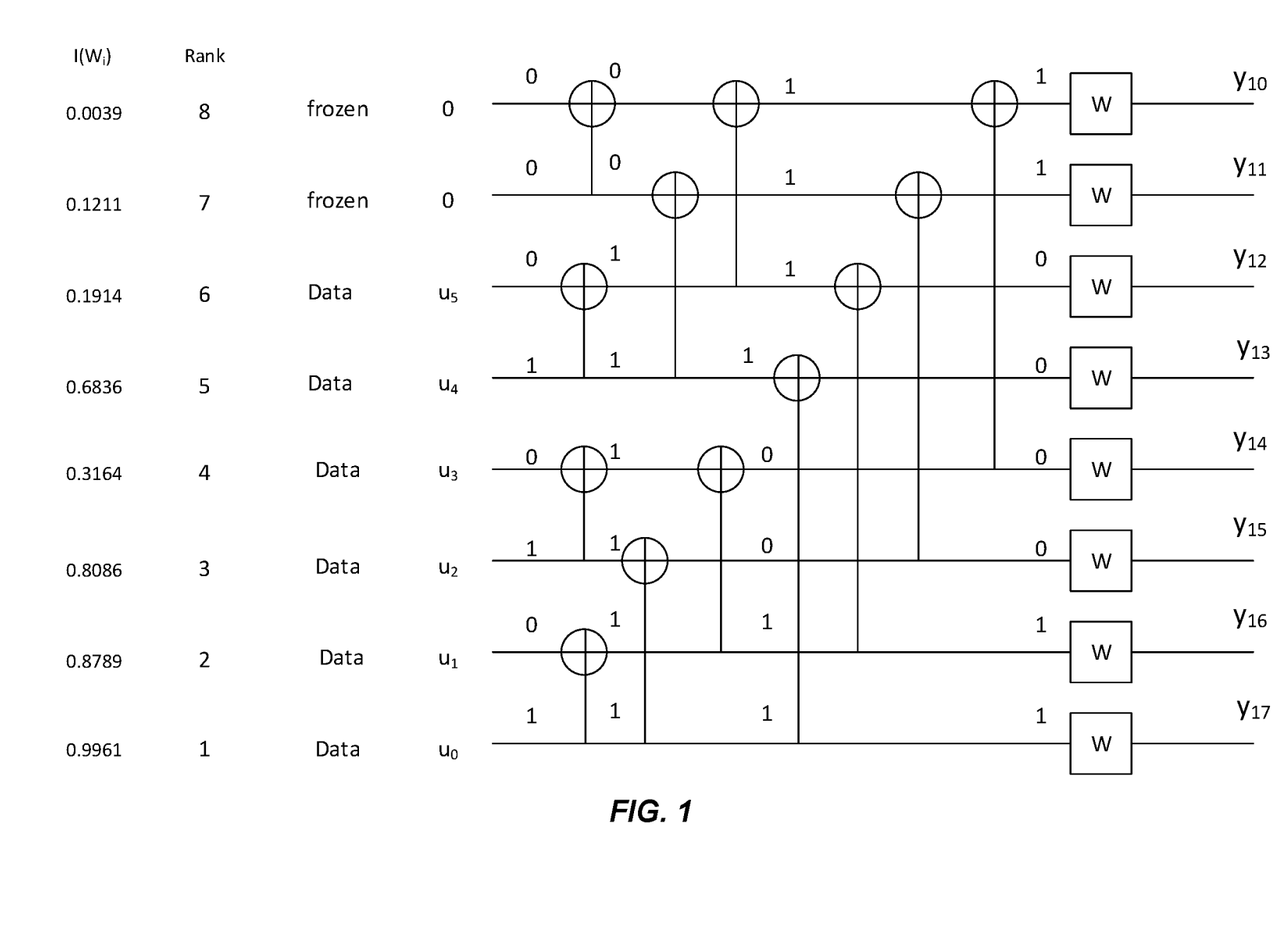
FIG. 1 illustrates an example of a polar code structure with N=8.

The main idea of polar coding is to transform a pair of identical binary-input channels into two distinct channels of different qualities, one better and one worse than the original binary-input channel. By repeating such a pair-wise polarizing operation on a set of $N=2^n$ independent uses of a binary-input channel, a set of $2^n$ "bit-channels" of varying qualities can be obtained. Some of these bit channels are nearly perfect (i.e., error free) while the rest of them are nearly useless (i.e., totally noisy). The point is to use the nearly perfect channel to transmit data to the receiver while setting the input to the useless channels to have fixed or frozen values (e.g., 0) known to the receiver. For this reason, those input bits to the nearly useless and the nearly perfect channel are commonly referred to as frozen bits and non-frozen (or information) bits, respectively. Only the non-frozen bits are used to carry data in a polar code. Loading the data into the proper information bit locations has direct impact on the performance of a polar code. The set of information bit locations is commonly referred to as an information set. An illustration of the structure of a length-8 polar code is illustrated in FIG. 1.

In general, the set of information bit locations varies with the number of channel uses, or equivalently the code length, N, as well as the number of data bits, or equivalently the number of information bit locations, K. However, it can be shown that with the commonly used Additive White Gaussian Noise (AWGN) channel model, for any code length N, if $K_1 < K_2$, then the information set $A_1$ with $K_1$ information bit locations is always a (proper) subset of the information set $A_2$ with $K_2$ information bit locations. As a result, with an AWGN channel, for any given code length N, in order to specify the information sets for all possible number of information bit locations, K, one needs only to store a ranking sequence $S_N$ of bit location indices of length N so that the first K indices in $S_N$ is the set of information bit locations if there are K data bits, for any $K \in \{1,2,\ldots,N\}$. Such a ranking sequence $S_N$ is referred to as the information sequence, from which the locations of bit-channels for carrying any number of data bits K can be derived.

Figure 2:
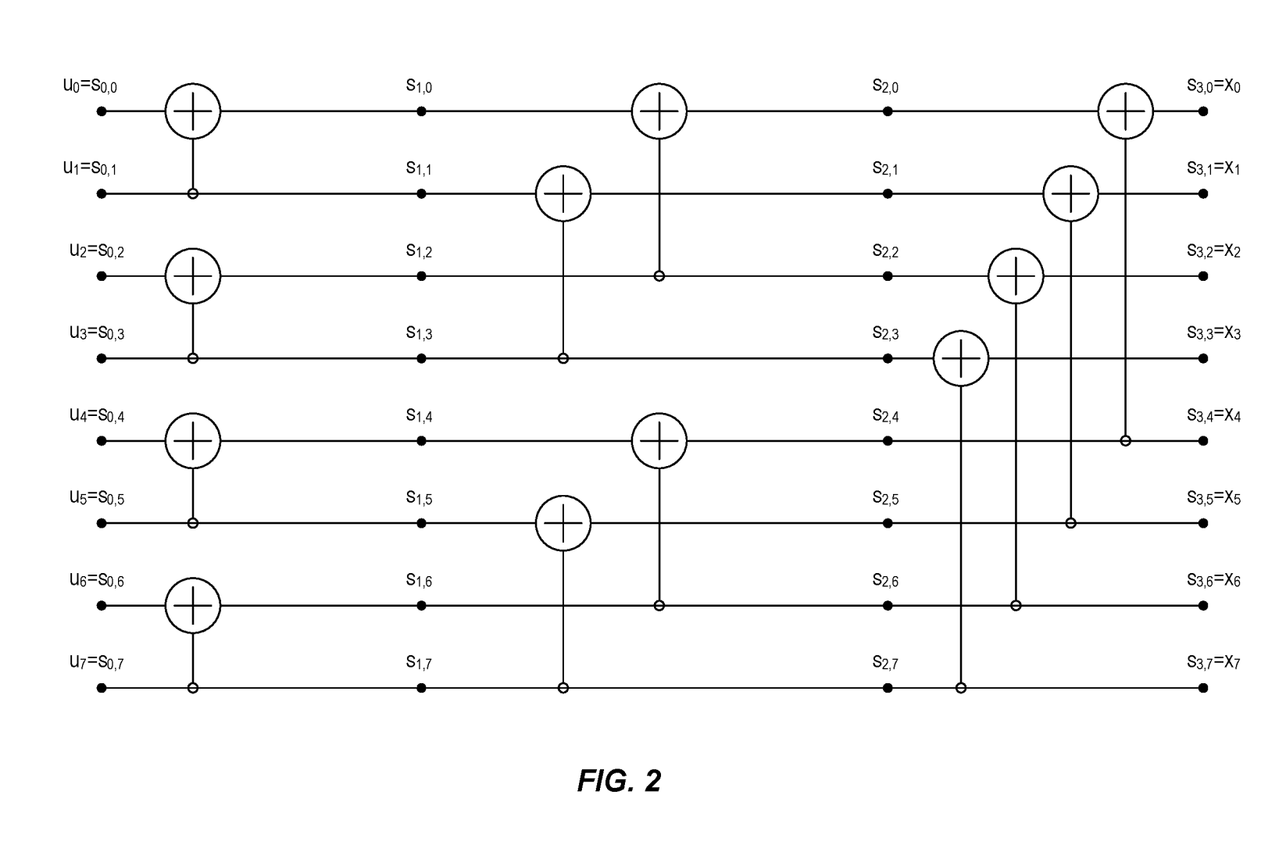
FIG. 2 shows labelling of intermediate bits in a polar code encoder with N=8.

FIG. 2 illustrates the labeling of the intermediate information bits $s_{l,i}$, where $l \in \{0, 1, \ldots, n\}$ and $i \in \{0, 1, \ldots, N-1\}$ during polar encoding with N=8. The intermediate information bits are related by the following equation:

$$s_{l+1,i} = s_{l,i} \otimes s_{l,i+2^l}, \text{ for}$$

$$i \in \left\{ j \in \{0, 1, \cdots, N-1\}: \mathrm{mod}\left(\left\lfloor \frac{j}{2^l} \right\rfloor, 2\right) = 0 \right\} \text{ and}$$

$$l \in \{0, 1, \cdots, n-1\}, \text{ and}$$

$$s_{l+1,i+2^l} = s_{l,i+2^l}, \text{ for}$$

$$i \in \left\{ j \in \{0, 1, \cdots, N-1\}: \mathrm{mod}\left(\left\lfloor \frac{j}{2^l} \right\rfloor, 2\right) = 0 \right\} \text{ and}$$

$$l \in \{0, 1, \cdots, n-1\}$$

where $s_{0,i} = u_i$ are the information bits and $s_{n,i} = x_i$ are the code bits for $i \in \{0,1,\ldots,N-1\}$.

SUMMARY

Systems and methods are disclosed for performing polar encoding of a number of information bits for transmission in a wireless communication system in a manner that is optimized for a specific code length. In some embodiments, a method of operation of a transmit node in a wireless communication system comprises performing polar encoding of a set of K information bits to thereby generate a set of polar-encoded information bits where the K information bits are mapped to the first K information bit locations specified in an information sequence $S_N$ which is a ranked sequence of N information bit locations among a plurality of input bits for the polar encoding where N is equivalent to a code length, a size of the information sequence $S_N$ is greater than or equal to K, and the information sequence $S_N$ is optimized for a specific value of the code length N. By using the information sequence $S_N$ that is optimized for the specific value of the code length N, performance is improved.

In some embodiments, the method further comprises transmitting the set of polar-encoded information bits.

In some embodiments, N=64, and the information sequence $S_N$ is:
$S_{64}$=[63 62 61 59 55 47 60 31 58 57 54 53 46 51 45 30 43 56 29 39 27 52 50 23 44 49 15 42 28 41 38 26 37 25 22 35 21 14 19 13 48 11 40 7 36 24 34 20 33 18 12 17 10 9 6 5 3 32 16 8 4 2 1 0].

In some embodiments, N=64, and the information sequence $S_N$ is:
$S_{64}$=[63 62 61 59 55 47 60 31 58 57 54 53 46 51 45 30 43 56 29 39 27 52 23 50 15 49 44 42 28 41 38 26 37 25 22 35 48 21 14 19 40 13 36 11 24 34 7 33 20 18 12 17 10 9 6 32 5 16 3 8 4 2 1 0].

In some embodiments, N=128, and the information sequence $S_N$ is: $S_{128}$=[127 126 125 123 119 111 124 95 122 121 118 63 117 110 115 109 94 107 120 93 103 91 62 116 114 61 87 108 113 59 106 79 92 105 55 102 90 101 47 89 60 86 99 85 112 58 31 78 57 83 54 104 77 53 100 75 46 88 51 98 45 71 84 97 30 43 29 56 76 82 81 39 52 74 27 50 73 44 23 70 49 15 96 69 42 67 41 28 38 80 26 37 72 25 35 22

48 68 21 14 40 66 19 13 65 36 11 24 7 34 33 20 18 12 64 17 10 32 9 6 5 3 16 8 4 2 1 0].

In some embodiments, the transmit node is a radio access node in a wireless communication system. In some other embodiments, the transmit node is a wireless communication device in a wireless communication system.

Embodiments of a transmit node for a wireless communication system are also disclosed. In some embodiments, a transmit node for a wireless communication system is adapted to perform polar encoding of a set of K information bits to thereby generate a set of polar-encoded information bits where: the K information bits are mapped to the first K information bit locations specified in an information sequence $S_N$, the information sequence $S_N$ being a ranked sequence of N information bit locations among a plurality of input bits for the polar encoding where N is equivalent to a code length; a size of the information sequence $S_N$ is greater than or equal to K; and the information sequence $S_N$ is optimized for a specific value of the code length N.

In some embodiments, the transmit node is further adapted to transmit the set of polar-encoded information bits.

In some embodiments, a transmit node for a wireless communication system comprises a polar encoder operable to perform polar encoding of a set of K information bits to thereby generate a set of polar-encoded information bits where: the K information bits are mapped to the first K information bit locations specified in an information sequence $S_N$, the information sequence $S_N$ being a ranked sequence of N information bit locations among a plurality of input bits for the polar encoding where N is equivalent to a code length; a size of the information sequence $S_N$ is greater than or equal to K; and the information sequence $S_N$ is optimized for a specific value of the code length N.

In some embodiments, the transmit node further comprises a transmitter operable to transmit the set of polar-encoded information bits.

In some embodiments, N=64, and the information sequence $S_N$ is:

$S_{64}$=[63 62 61 59 55 47 60 31 58 57 54 53 46 51 45 30 43 56 29 39 27 52 50 23 44 49 15 42 28 41 38 26 37 25 22 35 21 14 19 13 48 11 40 7 36 24 34 20 33 18 12 17 10 9 6 5 3 32 16 8 4 2 1 0].

In some embodiments, N=64, and the information sequence $S_N$ is:

$S_{64}$=[63 62 61 59 55 47 60 31 58 57 54 53 46 51 45 30 43 56 29 39 27 52 23 50 15 49 44 42 28 41 38 26 37 25 22 35 48 21 14 19 40 13 36 11 24 34 7 33 20 18 12 17 10 9 6 32 5 16 3 8 4 2 1 0].

In some embodiments, N=128, and the information sequence $S_N$ is: $S_{128}$=[127 126 125 123 119 111 124 95 122 121 118 63 117 110 115 109 94 107 120 93 103 91 62 116 114 61 87 108 113 59 106 79 92 105 55 102 90 101 47 89 60 86 99 85 112 58 31 78 57 83 54 104 77 53 100 75 46 88 51 98 45 71 84 97 30 43 29 56 76 82 81 39 52 74 27 50 73 44 23 70 49 15 96 69 42 67 41 28 38 80 26 37 72 25 35 22 48 68 21 14 40 66 19 13 65 36 11 24 7 34 33 20 18 12 64 17 10 32 9 6 5 3 16 8 4 2 1 0].

In some embodiments, the transmit node is a radio access node in a wireless communication system. In some other embodiments, the transmit node is a wireless communication device in a wireless communication system.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Radio Node: As used herein, a "radio node" is either a radio access node or a wireless device.

Radio Access Node: As used herein, a "radio access node" or "radio network node" is any node in a radio access network of a cellular communications network that operates to wirelessly transmit and/or receive signals. Some examples of a radio access node include, but are not limited to, a base station (e.g., a New Radio (NR) base station (gNB) in a Third Generation Partnership Project (3GPP) Fifth Generation (5G) NR network or an enhanced or evolved Node B (eNB) in a 3GPP Long Term Evolution (LTE) network), a high-power or macro base station, a low-power base station (e.g., a micro base station, a pico base station, a home eNB, or the like), and a relay node.

Core Network Node: As used herein, a "core network node" is any type of node in a core network. Some examples of a core network node include, e.g., a Mobility Management Entity (MME), a Packet Data Network Gateway (P-GW), a Service Capability Exposure Function (SCEF), or the like.

Wireless Device: As used herein, a "wireless device" is any type of device that has access to (i.e., is served by) a cellular communications network by wirelessly transmitting and/or receiving signals to a radio access node(s). Some examples of a wireless device include, but are not limited to, a User Equipment device (UE) in a 3GPP network and a Machine Type Communication (MTC) device.

Network Node: As used herein, a "network node" is any node that is either part of the radio access network or the core network of a cellular communications network/system.

Note that the description given herein focuses on a 3GPP cellular communications system and, as such, 3GPP terminology or terminology similar to 3GPP terminology is oftentimes used. However, the concepts disclosed herein are not limited to a 3GPP system.

Note that, in the description herein, reference may be made to the term "cell;" however, particularly with respect to 5G NR concepts, beams may be used instead of cells and, as such, it is important to note that the concepts described herein are equally applicable to both cells and beams.

Systems and methods are disclosed herein relating to polar codes and the use thereof in a wireless communications system.

A main design issue of polar coding is to identify the information sequence from which the locations of bit-channels for carrying K data bits can be obtained for a given code length N. In [4], it is proposed that such an information sequence can be obtained by assigning a weight for each bit channel indexed by j based on the following polarization weight function:

$$W(j) = \sum_{i=0}^{n-1} b_i \beta^i$$

where $\beta=2^{1/4}$ and $j=\sum_{i=0}^{n-1} b_i 2^i$ is the binary expansion of the bit-channel index j.

The information sequence is obtained simply by sorting values of W(i) for i $\in \{0,1,2, \ldots, 2^n\}$. This information sequence is referred to as the Polarization Weight (PW) sequence.

One problem with the PW sequence is that it imposes an artificial relationship among the relative reliabilities of different bit channels as dictated by the PW function. Moreover, the value of the weight $\beta$ is derived assuming a Successive Cancellation (SC) decoder instead of an SC List (SCL) decoder, which is more commonly used in practice.

In this disclosure, information sequences that are numerically optimized for some specific code length N are presented. The optimization is done in such a way that takes into account the performance of SCL decoders of different list sizes at different operating levels of Block Error Rate (BLER) (e.g., BLER=1% or 0.1%). Embodiments of the present disclosure provide a set of information sequences that are individually optimized for a set of specific code block lengths.

Some specific embodiments for code block lengths of N=64 and N=128 are as follows.

Code Sequence for Length N=64: Listed below are two length-64 sequences that perform well with an SCL decoder and an SC decoder in practice.

a) $S_{64}$=[63 62 61 59 55 47 60 31 58 57 54 53 46 51 45 30 43 56 29 39 27 52 50 23 44 49 15 42 28 41 38 26 37 25 22 35 21 14 19 13 48 11 40 7 36 24 34 20 33 18 12 17 10 9 6 5 3 32 16 8 4 2 1 0]

b) $S_{64}$=[63 62 61 59 55 47 60 31 58 57 54 53 46 51 45 30 43 56 29 39 27 52 23 50 15 49 44 42 28 41 38 26 37 25 22 35 48 21 14 19 40 13 36 11 24 34 7 33 20 18 12 17 10 9 6 32 5 16 3 8 4 2 1 0]

Code Sequence for Length N=128: Listed below is the length-128 sequence that performs well with an SCL decoder and an SC decoder in practice.

a) $S_{128}$=[127 126 125 123 119 111 124 95 122 121 118 63 117 110 115 109 94 107 120 93 103 91 62 116 114 61 87 108 113 59 106 79 92 105 55 102 90 101 47 89 60 86 99 85 112 58 31 78 57 83 54 104 77 53 100 75 46 88 51 98 45 71 84 97 30 43 29 56 76 82 81 39 52 74 27 50 73 44 23 70 49 15 96 69 42 67 41 28 38 80 26 37 72 25 35 22 48 68 21 14 40 66 19 13 65 36 11 24 7 34 33 20 18 12 64 17 10 32 9 6 5 3 16 8 4 2 1 0]

A key advantage of the proposed information sequences is that they generally yield better performance for the code lengths that they are designed than the PW sequence since they are individually optimized.

Figure 3:
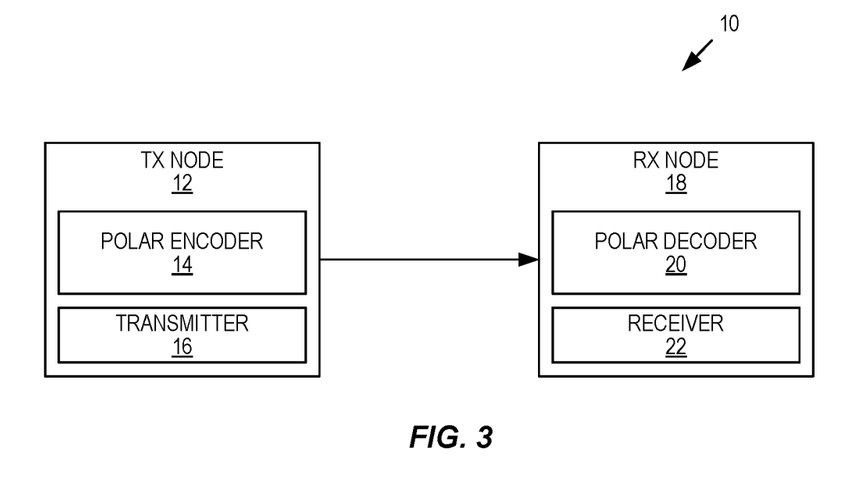
FIG. 3 illustrates one example of a system in which embodiments of the present disclosure may be implemented.

FIG. 3 illustrates a wireless communications system 10 including a transmit (TX) node 12 that includes a polar encoder 14 (i.e., a polar code encoder) and a transmitter 16, and a receive (RX) node 18 that includes a polar decoder 20 (i.e., a polar code decoder) and a receiver 22 in accordance with some embodiments of the present disclosure. The polar encoder 14 may be implemented in hardware or a combination of hardware and software (e.g., software stored on memory and executed by a processor(s)). The transmitter 16 includes various hardware components such as, e.g., Digital-to-Analog Converter(s) (DAC(s)), filter(s), mixer(s), amplifier(s), and/or the like. Likewise, the polar decoder 20 may be implemented in hardware or a combination of hardware and software (e.g., software stored on memory and executed by a processor(s)). The receiver 22 includes various hardware components such as, e.g., an Analog-to-Digital Converter(s) (ADC(s)), filter(s), mixer(s), amplifier(s), and/or the like. The wireless communications system 10 may be any type of wireless communications system such as, but not limited to, a cellular communications network in which the transmit node 12 is, e.g., a radio access node (e.g., a base station) and the receive node 18 is a wireless device or terminal (e.g., a UE), or vice versa.

Figure 4:
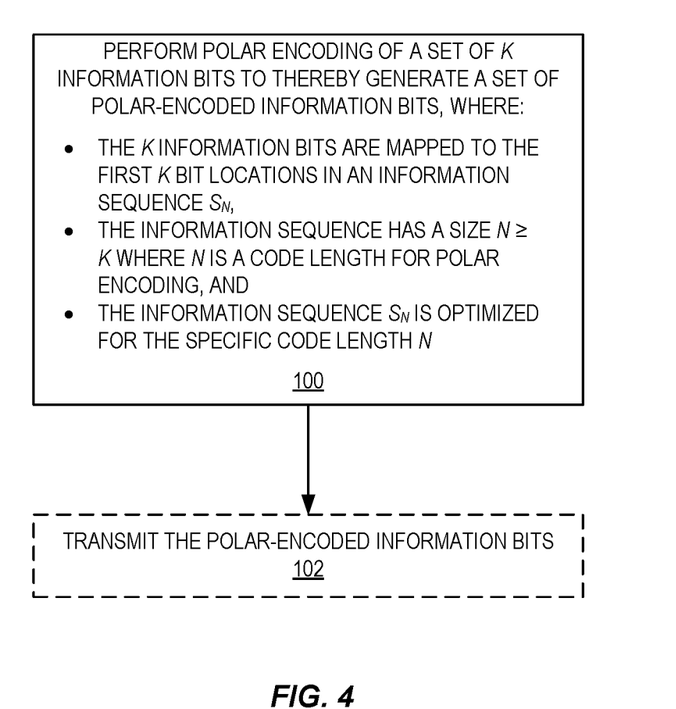
FIG. 4 is a flow chart that illustrates the operation of a transmit node in accordance with some embodiments of the present disclosure.

FIG. 4 is a flow chart that illustrates the operation of the transmit node 12 in accordance with some embodiments of the present disclosure.

Optional steps are represented by a dashed box. As illustrated, the transmit node 12, and in particular the polar encoder 14, performs polar encoding of a set of K information bits to thereby generate a set of polar-encoded information bits (step 100). For polar encoding, there is a set of input bit locations for the polar encoder 14 consisting of N information bit (i.e., not frozen bit) locations and one or more non-information (i.e., frozen) bit locations, where N is the code length and N≥K. The N information bit locations are referred to as an information set. An information sequence $S_N$ (i.e., a ranking sequence of the information bit locations) is optimized for the specific code length N. The K information bits are mapped to the first K bit locations in the information sequence $S_N$.

In some embodiments, N=64 and the information sequence $S_N$ is either:

a) $S_{62}$=[63 62 61 59 55 47 60 31 58 57 54 53 46 51 45 30 43 56 29 39 27 52 50 23 44 49 15 42 28 41 38 26 37 25 22 35 21 14 19 13 48 11 40 7 36 24 34 20 33 18 12 17 10 9 6 5 3 32 16 8 4 2 1 0]

b) $S_{64}$=[63 62 61 59 55 47 60 31 58 57 54 53 46 51 45 30 43 56 29 39 27 52 23 50 15 49 44 42 28 41 38 26 37 25 22 35 48 21 14 19 40 13 36 11 24 34 7 33 20 18 12 17 10 9 6 32 5 16 3 8 4 2 1 0]

In some other embodiments, N=128 and the information sequence $S_N$ is:

a) $S_{128}$=[127 126 125 123 119 111 124 95 122 121 118 63 117 110 115 109 94 107 120 93 103 91 62 116 114 61 87 108 113 59 106 79 92 105 55 102 90 101 47 89 60 86 99 85 112 58 31 78 57 83 54 104 77 53 100 75 46 88 51 98 45 71 84 97 30 43 29 56 76 82 81 39 52 74 27 50 73 44 23 70 49 15 96 69 42 67 41 28 38 80 26 37 72 25 35 22 48 68 21 14 40 66 19 13 65 36 11 24 7 34 33 20 18 12 64 17 10 32 9 6 5 3 16 8 4 2 1 0]

Optionally, the transmit node 12, and more specifically the transmitter 16, transmits the polar-encoded information bits (step 102). Notably, other optional steps (e.g., rate-matching) may be performed after polar encoding and prior to transmission.

Figure 5:
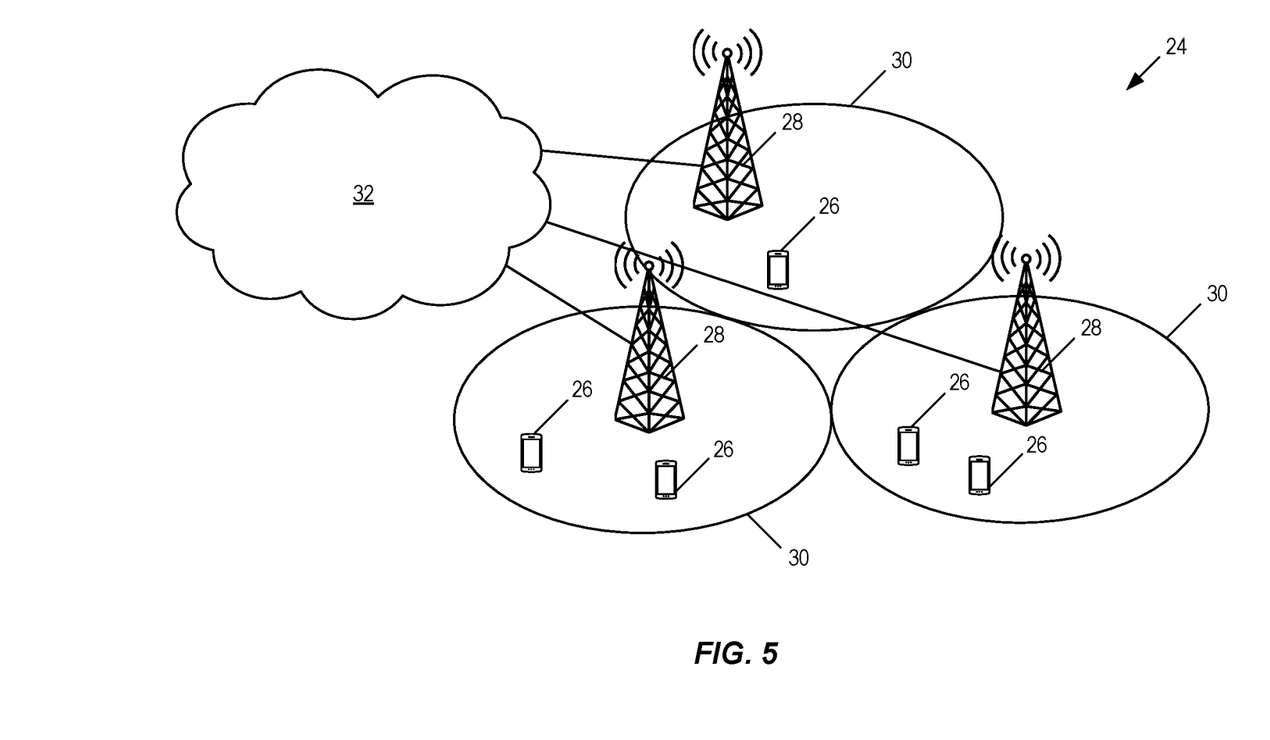
FIG. 5 illustrates one example of a wireless communication system in which embodiments of the present disclosure may be implemented.

FIG. 5 illustrates one example of a wireless communication system 24 in which embodiments of the present disclosure may be implemented. The wireless communication system 24 is preferably a 3GPP 5G NR system, but is not limited thereto. As illustrated, the wireless communication system 24 includes a number of wireless communication devices 26, which are also referred to herein as UEs. In addition, the wireless communication system 24 includes a radio access network that includes a number of radio access nodes 28 (e.g., gNBs) serving corresponding coverage areas or cells 30. The radio access nodes 28 are connected to a core network 32, which includes a number of core network nodes, as will be appreciated by one of skill in the art.

As an example, the radio access node 28 and/or the wireless communication device 26 may operate as the transmit node 12 described above.

Figure 6:
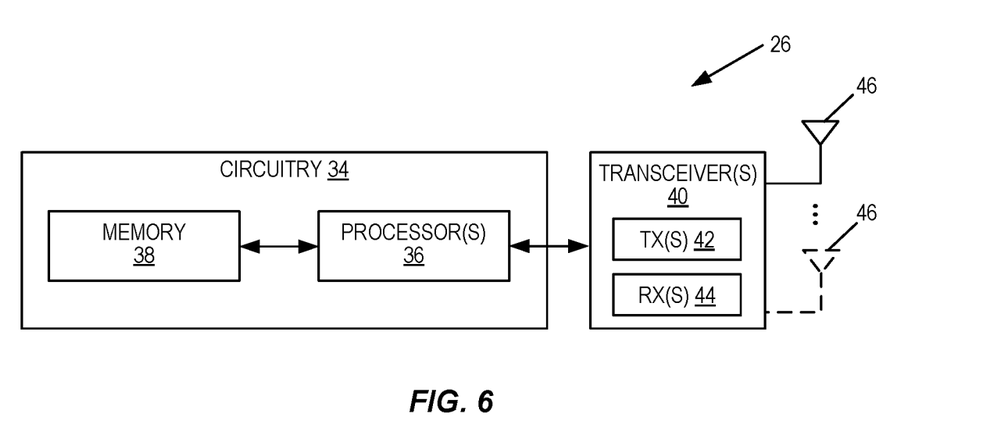
FIGS. 6 and 7 illustrate example embodiments of a wireless communication device.

FIG. 6 is a schematic block diagram of the wireless communication device 26, or UE, according to some embodiments of the present disclosure. As illustrated, the wireless communication device 26 includes circuitry 34 comprising one or more processors 36 (e.g., Central Processing Units (CPUs), Application Specific Integrated Circuits (ASICs), Field Programmable Gate Arrays (FPGAs), Digital Signal Processors (DSPs), and/or the like) and memory 38. The wireless communication device 26 also includes one or more transceivers 40 each including one or more transmitters 42 and one or more receivers 44 coupled to one or more antennas 46. In some embodiments, the functionality of the wireless communication device 26 described herein may be implemented in hardware (e.g., via hardware within the circuitry 34 and/or within the processor(s) 36) or be implemented in a combination of hardware and software (e.g., fully or partially implemented in software that is, e.g., stored in the memory 38 and executed by the processor(s) 36).

In some embodiments, a computer program including instructions which, when executed by the at least one processor 36, causes the at least one processor 36 to carry out at least some of the functionality of the wireless communication device 26 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as memory).

Figure 7:
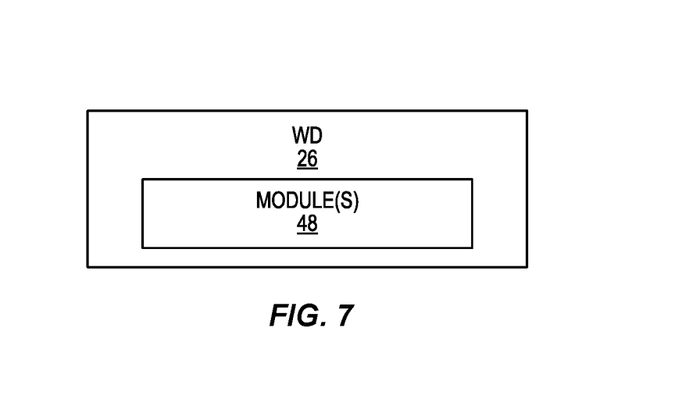

FIG. 7 is a schematic block diagram of the wireless communication device 26, or UE, according to some other embodiments of the present disclosure. The wireless communication device 26 includes one or more modules 48, each of which is implemented in software. The module(s) 48 provide the functionality of the wireless communication device 26, or more specifically the transmit node 12, described herein (e.g., as described with respect to FIGS. 3 and 4).

Figure 8:
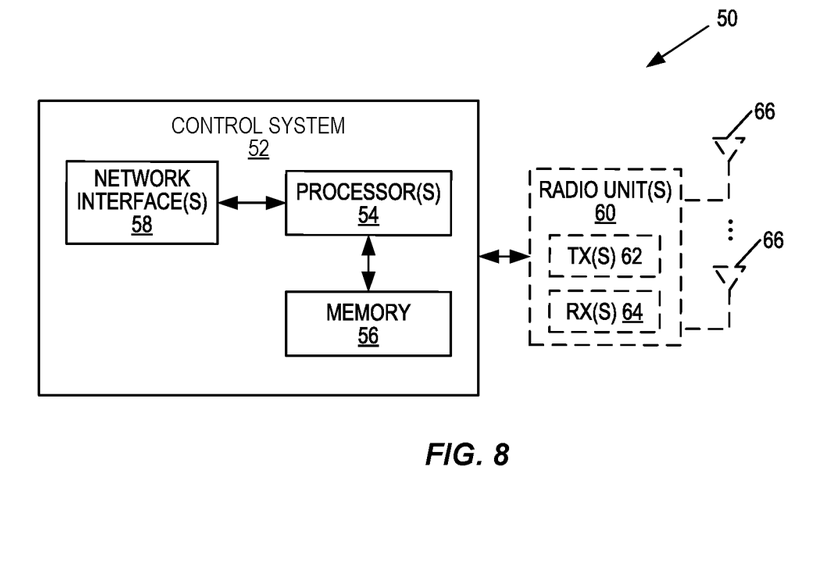
FIGS. 8 through 10 illustrate example embodiments of a network node.

FIG. 8 is a schematic block diagram of a network node 50 (e.g., a radio access node 28 such as, for example, a gNB) according to some embodiments of the present disclosure. As illustrated, the network node 50 includes a control system 52 that includes circuitry comprising one or more processors 54 (e.g., CPUs, ASICs, DSPs, FPGAs, and/or the like) and memory 56. The control system 52 also includes a network interface 58. In embodiments in which the network node 50 is a radio access node 28, the network node 50 also includes one or more radio units 60 that each include one or more transmitters 62 and one or more receivers 64 coupled to one or more antennas 66. In some embodiments, the functionality of the network node 50 (specifically the functionality of the radio access node 28 or transmit node 12) described above may be fully or partially implemented in software that is, e.g., stored in the memory 56 and executed by the processor(s) 54.

Figure 9:
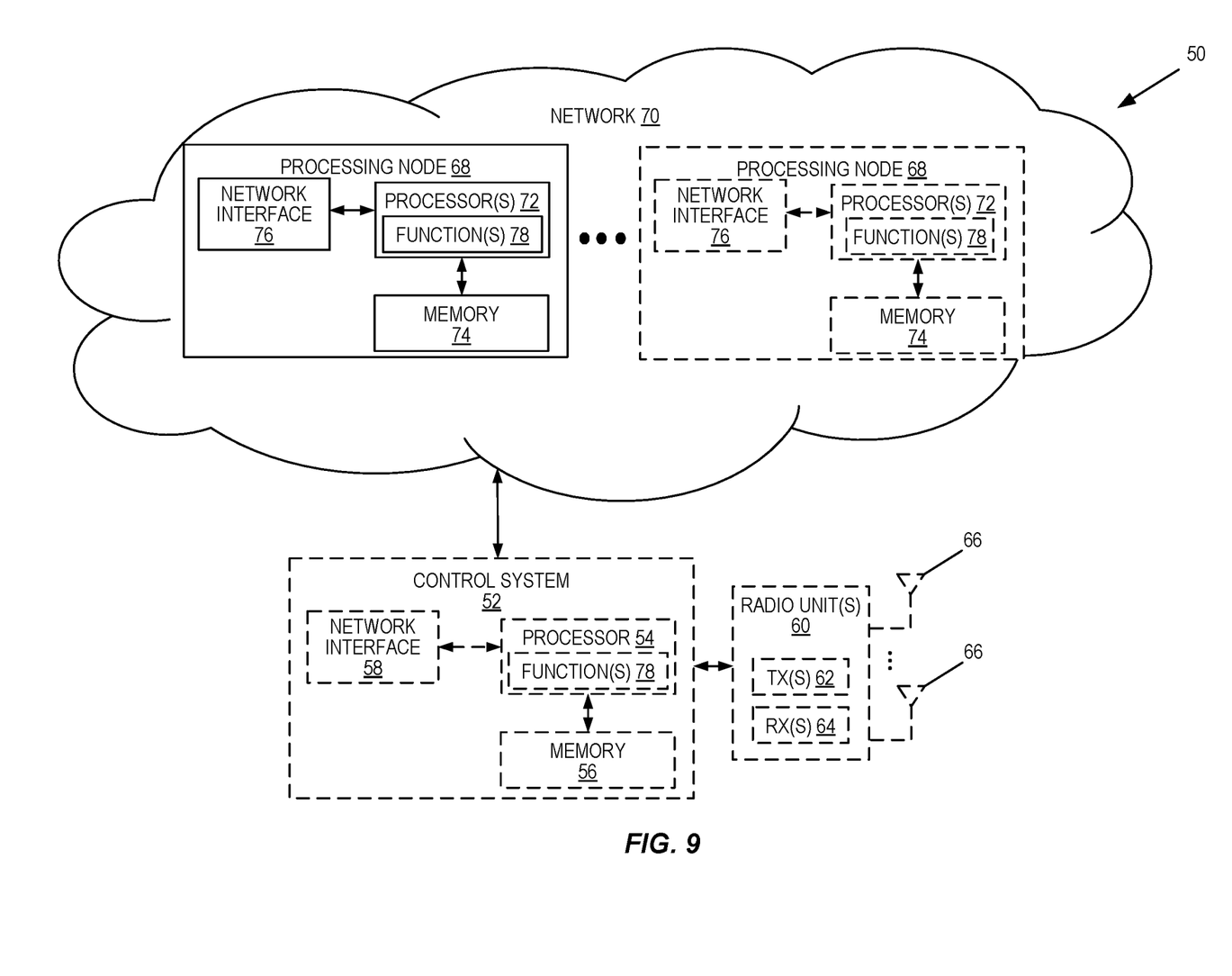

FIG. 9 is a schematic block diagram that illustrates a virtualized embodiment of the network node 50 (e.g., the radio access node 28) according to some embodiments of the present disclosure. As used herein, a "virtualized" network node 50 is a network node 50 in which at least a portion of the functionality of the network node 50 is implemented as a virtual component (e.g., via a virtual machine(s) executing on a physical processing node(s) in a network(s)). As illustrated, the network node 50 optionally includes the control system 52, as described with respect to FIG. 8. In addition, if the network node 50 is the radio access node 28, the network node 50 also includes the one or more radio units 60, as described with respect to FIG. 8. The control system 52 (if present) is connected to one or more processing nodes 68 coupled to or included as part of a network(s) 70 via the network interface 58. Alternatively, if the control system 52 is not present, the one or more radio units 60 (if present) are connected to the one or more processing nodes 68 via a network interface(s). Alternatively, all of the functionality of the network node 50 (e.g., all of the functionality of the radio access node 28) described herein may be implemented in the processing nodes 68. Each processing node 68 includes one or more processors 72 (e.g., CPUs, ASICs, DSPs, FPGAs, and/or the like), memory 74, and a network interface 76.

In this example, functions 78 of the network node 50 (e.g., the functions of the radio access node 28 or transmit node 12) described herein are implemented at the one or more processing nodes 70 or distributed across the control system 52 (if present) and the one or more processing nodes 68 in any desired manner. In some particular embodiments, some or all of the functions 78 of the network node 50 described herein are implemented as virtual components executed by one or more virtual machines implemented in a virtual environment(s) hosted by the processing node(s) 68. As will be appreciated by one of ordinary skill in the art, additional signaling or communication between the processing node(s) 68 and the control system 52 (if present) or alternatively the radio unit(s) 60 (if present) is used in order to carry out at least some of the desired functions. Notably, in some embodiments, the control system 52 may not be included, in which case the radio unit(s) 60 (if present) communicates directly with the processing node(s) 68 via an appropriate network interface(s).

In some particular embodiments, higher layer functionality (e.g., layer 3 and up and possibly some of layer 2 of the protocol stack) of the network node 50 may be implemented at the processing node(s) 68 as virtual components (i.e., implemented "in the cloud") whereas lower layer functionality (e.g., layer 1 and possibly some of layer 2 of the protocol stack) may be implemented in the radio unit(s) 60 and possibly the control system 52.

In some embodiments, a computer program including instructions which, when executed by the at least one processor 54, 72, causes the at least one processor 54, 72 to carry out the functionality of the network node 50 or a processing node 68 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as the memory 56, 74).

Figure 10:
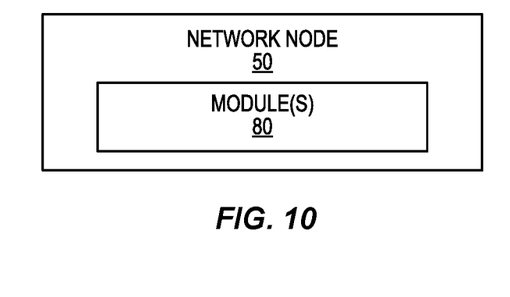

FIG. 10 is a schematic block diagram of the network node 50 (e.g., the radio access node 28) according to some other embodiments of the present disclosure. The network node 50 includes one or more modules 80, each of which is implemented in software. The module(s) 80 provide the functionality of the network node 50 described herein (e.g., the functionality of the transmit node 12 as described herein, e.g., with respect to FIGS. 3 and 4).

While not being limited thereto, some example embodiments of the present disclosure are provided below.

Embodiment 1: A method of operation of a transmit node (12) in a wireless communication system (10), comprising performing (100) polar encoding of a set of K information bits to thereby generate a set of polar-encoded information bits where: the K information bits are mapped to the first K bit locations in an information sequence $S_N$, the information sequence $S_N$ being a ranked sequence of N information bit locations among a plurality of input bits for the polar encoding where N is equivalent to a code length; a size of the information sequence $S_N$ is greater than or equal to K (i.e., N≥K); and the information sequence $S_N$ is optimized for the specific value of the code length (i.e., for the specific value of N).

Embodiment 2: The method of embodiment 1 further comprising transmitting (102) the set of polar-encoded information bits.

Embodiment 3: The method of embodiment 1 or 2 wherein N=64, and the information sequence $S_N$ is:
$S_{64}$=[63 62 61 59 55 47 60 31 58 57 54 53 46 51 45 30 43 56 29 39 27 52 50 23 44 49 15 42 28 41 38 26 37 25 22 35 21 14 19 13 48 11 40 7 36 24 34 20 33 18 12 17 10 9 6 5 3 32 16 8 4 2 1 0].

Embodiment 4: The method of embodiment 1 or 2 wherein N=64, and the information sequence $S_N$ is:
$S_{64}$=[63 62 61 59 55 47 60 31 58 57 54 53 46 51 45 30 43 56 29 39 27 52 23 50 15 49 44 42 28 41 38 26 37 25 22 35 48 21 14 19 40 13 36 11 24 34 7 33 20 18 12 17 10 9 6 32 5 16 3 8 4 2 1 0].

Embodiment 5: The method of embodiment 1 or 2 wherein N=128, and the information sequence $S_N$ is:
$S_{128}$=[127 126 125 123 119 111 124 95 122 121 118 63 117 110 115 109 94 107 120 93 103 91 62 116 114 61 87 108 113 59 106 79 92 105 55 102 90 101 47 89 60 86 99 85 112 58 31 78 57 83 54 104 77 53 100 75 46 88 51 98 45 71 84 97 30 43 29 56 76 82 81 39 52 74 27 50 73 44 23 70 49 15 96 69 42 67 41 28 38 80 26 37 72 25 35 22 48 68 21 14 40 66 19 13 65 36 11 24 7 34 33 20 18 12 64 17 10 32 9 6 5 3 16 8 4 2 1 0].

Embodiment 6: The method of any one of embodiments 1 to 5 wherein the transmit node (12) is a radio access node (28) in a wireless communication system (24).

Embodiment 7: The method of any one of embodiments 1 to 5 wherein the transmit node (12) is a wireless communication device (26) in a wireless communication system (24).

Embodiment 8: A transmit node (12) in a wireless communication system (10), the transmit node (12) adapted to perform the method of any one of embodiments 1 to 7.

Embodiment 9: A transmit node (12) comprising a polar encoder (14) operable to perform polar encoding of a set of K information bits to thereby generate a set of polar-encoded information bits where: the K information bits are mapped to the first K bit locations in an information sequence $S_N$, the information sequence $S_N$ being a ranked sequence of N information bit locations among a plurality of input bits for the polar encoding where N is equivalent to a code length; a size of the information sequence $S_N$ is greater than or equal to K (i.e., N≥K); and the information sequence $S_N$ is optimized for the specific value of the code length (i.e., for the specific value of N).

Embodiment 10: The transmit node (12) of embodiment 9 further comprising a transmitter (16) operable to transmit the set of polar-encoded information bits.

Embodiment 11: The transmit node (12) of embodiment 9 or 10 wherein N=64, and the information sequence $S_N$ is:
$S_{64}$=[63 62 61 59 55 47 60 31 58 57 54 53 46 51 45 30 43 56 29 39 27 52 50 23 44 49 15 42 28 41 38 26 37 25 22 35 21 14 19 13 48 11 40 7 36 24 34 20 33 18 12 17 10 9 6 5 3 32 16 8 4 2 1 0].

Embodiment 12: The transmit node (12) of embodiment 9 or 10 wherein N=64, and the information sequence $S_N$ is:
$S_{64}$=[63 62 61 59 55 47 60 31 58 57 54 53 46 51 45 30 43 56 29 39 27 52 23 50 15 49 44 42 28 41 38 26 37 25 22 35 48 21 14 19 40 13 36 11 24 34 7 33 20 18 12 17 10 9 6 32 5 16 3 8 4 2 1 0].

Embodiment 13: The transmit node (12) of embodiment 9 or 10 wherein N=128, and the information sequence $S_N$ is:
$S_{128}$=[127 126 125 123 119 111 124 95 122 121 118 63 117 110 115 109 94 107 120 93 103 91 62 116 114 61 87 108 113 59 106 79 92 105 55 102 90 101 47 89 60 86 99 85 112 58 31 78 57 83 54 104 77 53 100 75 46 88 51 98 45 71 84 97 30 43 29 56 76 82 81 39 52 74 27 50 73 44 23 70 49 15 96 69 42 67 41 28 38 80 26 37 72 25 35 22 48 68 21 14 40 66 19 13 65 36 11 24 7 34 33 20 18 12 64 17 10 32 9 6 5 3 16 8 4 2 1 0].

Embodiment 14: The transmit node (12) of any one of embodiments 9 to 13 wherein the transmit node (12) is a radio access node (28) in a wireless communication system (24).

Embodiment 15: The transmit node (12) of any one of embodiments 9 to 13 wherein the transmit node (12) is a wireless communication device (26) in a wireless communication system (24).

Embodiment 16: A network node (12, 26, 50) comprising: one or more modules (48, 80) operable to perform the method of any one of embodiments 1 to 7.

Embodiment 17: A computer program comprising instructions which, when executed on at least one processor, cause the at least one processor to carry out the method according to any one of embodiments 1 to 7.

Embodiment 18: A carrier containing the computer program of embodiment 17, wherein the carrier is one of an electronic signal, an optical signal, a radio signal, or a computer readable storage medium.

The following acronyms are used throughout this disclosure.

3GPP Third Generation Partnership Project 5G Fifth Generation
ADC Analog-to-Digital Converter
ASIC Application Specific Integrated Circuit
AWGN Additive White Gaussian Noise
BLER Block Error Rate
CPU Central Processing Unit
CRC Cyclic Redundancy Check
DAC Digital-to-Analog Converter
DSP Digital Signal Processor
eNB Enhanced or Evolved Node B
FPGA Field Programmable Gate Array
gNB New Radio Base Station
LDPC Low-Density Parity-Check
LTE Long Term Evolution
ML Maximum-Likelihood MME Mobility Management Entity
MTC Machine Type Communication
NR New Radio
P-GW Packet Data Network Gateway
PW Polarization Weight
RX Receive
SC Successive Cancellation
SCEF Service Capability Exposure Function
SCL Successive Cancellation List
TX Transmit
UE User Equipment Those skilled in the art will recognize improvements and modifications to the embodiments of the present disclosure. All such improvements and modifications are considered within the scope of the concepts disclosed herein.

LIST OF REFERENCES

[1] E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009.

[2] I. Tal and A. Vardy, "List Decoding of polar codes," Proceedings of IEEE
Symp. Inf. Theory, pp. 1-5, 2011.

[3] Leroux et al., "A Semi-Parallel Successive-Cancellation Decoder for Polar Codes," IEEE Transactions On Signal Processing, Vol. 61, No. 2, Jan. 15, 2013.

[4] Huawei, HiSilicon, "Polar code design and rate matching," 3GPP contribution R1-167209, September 2016.

What is claimed is:

1. A method of operation of a transmit node in a wireless communication system, comprising:
performing polar encoding of a set of K information bits to thereby generate a set of polar-encoded information bits where:
the K information bits are mapped to the first K information bit locations specified in an information sequence $S_N$, the information sequence $S_N$ being a ranked sequence of N information bit locations among a plurality of input bits for the polar encoding where N is equivalent to a code length;
a size of the information sequence $S_N$ is greater than or equal to K; and
N is a code length of 64 or 128;
if N is a code length of 64, the information sequence is:
$S_{64}$=[63 62 61 59 55 47 60 31 58 57 54 53 46 51 45 30 43 56 29 39 27 52 50 23 44 49 15 42 28 41 38 26 37 25 22 35 21 14 19 13 48 11 40 7 36 24 34 20 33 18 12 17 10 9 6 5 3 32 16 8 4 2 1 0]; or
$S_{64}$=[63 62 61 59 55 47 60 31 58 57 54 53 46 51 45 30 43 56 29 39 27 52 50 23 44 49 15 42 28 41 38 26 37 25 22 35 21 14 19 13 48 11 40 7 36 24 34 20 33 18 12 17 10 9 6 5 3 32 16 8 4 2 1 0]; and
if N is a code length of 128;
$S_{128}$=[127 126 125 123 119 111 124 95 122 121 118 63 117 110 115 109 94 107 120 93 103 91 62 116 114 61 87 108 113 59 106 79 92 105 55 102 90 101 47 89 60 86 99 85 112 58 31 78 57 83 54 104 77 53 100 75 46 88 51 98 45 71 84 97 30 43 29 56 76 82 81 39 52 74 27 50 73 44 23 70 49 15 96 69 42 67 41 28 38 80 26 37 72 25 35 22 48 68 21 14 40 66 19 13 65 36 11 24 7 34 33 20 18 12 64 17 10 32 9 6 5 3 16 8 4 2 1 0]; and
transmitting the set of polar-encoded information bits.

2. The method of claim 1 wherein N is a code length of 64, and the information sequence $S_N$ is:
$S_{64}$=[63 62 61 59 55 47 60 31 58 57 54 53 46 51 45 30 43 56 29 39 27 52 50 23 44 49 15 42 28 41 38 26 37 25 22 35 21 14 19 13 48 11 40 7 36 24 34 20 33 18 12 17 10 9 6 5 3 32 16 8 4 2 1 0].

3. The method of claim 1 wherein N is a code length of 64, and the information sequence $S_N$ is:
$S_{64}$=[63 62 61 59 55 47 60 31 58 57 54 53 46 51 45 30 43 56 29 39 27 52 23 50 15 49 44 42 28 41 38 26 37 25 22 35 48 21 14 19 40 13 36 11 24 34 7 33 20 18 12 17 10 9 6 32 5 16 3 8 4 2 1 0].

4. The method of claim 1 wherein N is a code length of 128, and the information sequence $S_N$ is:
$S_{128}$=[127 126 125 123 119 111 124 95 122 121 118 63 117 110 115 109 94 107 120 93 103 91 62 116 114 61 87 108 113 59 106 79 92 105 55 102 90 101 47 89 60 86 99 85 112 58 31 78 57 83 54 104 77 53 100 75 46 88 51 98 45 71 84 97 30 43 29 56 76 82 81 39 52 74 27 50 73 44 23 70 49 15 96 69 42 67 41 28 38 80 26 37 72 25 35 22 48 68 21 14 40 66 19 13 65 36 11 24 7 34 33 20 18 12 64 17 10 32 9 6 5 3 16 8 4 2 1 0].

5. The method of claim 1 wherein the transmit node is a radio access node in a wireless communication system.

6. The method of claim 1 wherein the transmit node is a wireless communication device in a wireless communication system.

7. A transmit node comprising:
a polar encoder operable to perform polar encoding of a set of K information bits to thereby generate a set of polar-encoded information bits where:
the K information bits are mapped to the first K information bit locations specified in an information sequence $S_N$, the information sequence $S_N$ being a ranked sequence of N information bit locations among a plurality of input bits for the polar encoding where N is equivalent to a code length;
a size of the information sequence $S_N$ is greater than or equal to K;
N is a code length of 64 or 128;
if N is a code length of 64, the information sequence is:
$S_{64}$=[63 62 61 59 55 47 60 31 58 57 54 53 46 51 45 30 43 56 29 39 27 52 50 23 44 49 15 42 28 41 38 26 37 25 22 35 21 14 19 13 48 11 40 7 36 24 34 20 33 18 12 17 10 9 6 5 3 32 16 8 4 2 1 0]; or
$S_{64}$=[63 62 61 59 55 47 60 31 58 57 54 53 46 51 45 30 43 56 29 39 27 52 23 50 15 49 44 42 28 41 38 26 37 25 22 35 48 21 14 19 40 13 36 11 24 34 7 33 20 18 12 17 10 9 6 32 5 16 3 8 4 2 1 0]; and
if N is a code length of 128, the information sequence is:
the information sequence is $S_{128}$=[127 126 125 123 119 111 124 95 122 121 118 63 117 110 115 109 94 107 120 93 103 91 62 116 114 61 87 108 113 59 106 79 92 105 55 102 90 101 47 89 60 86 99 85 112 58 31 78 57 83 54 104 77 53 100 75 46 88 51 98 45 71 84 97 30 43 29 56 76 82 81 39 52 74 27 50 73 44 23 70 49 15 96 69 42 67 41 28 38 80 26 37 72 25 35 22 48 68 21 14 40 66 19 13 65 36 11 24 7 34 33 20 18 12 64 17 10 32 9 6 5 3 16 8 4 2 1 0]; and
a transmitter operable to transmit the set of polar-encoded information bits.

8. The transmit node of claim 7 wherein N is a code length of 64, and the information sequence $S_N$ is:
$S_{64}$=[63 62 61 59 55 47 60 31 58 57 54 53 46 51 45 30 43 56 29 39 27 52 50 23 44 49 15 42 28 41 38 26 37

25 22 35 21 14 19 13 48 11 40 7 36 24 34 20 33 18 12 17 10 9 6 5 3 32 16 8 4 2 1 0].

9. The transmit node of claim 7 wherein N is a code length of 64, and the information sequence $S_N$ is:

$S_{64}$=[63 62 61 59 55 47 60 31 58 57 54 53 46 51 45 30 43 56 29 39 27 52 23 50 15 49 44 42 28 41 38 26 37 25 22 35 48 21 14 19 40 13 36 11 24 34 7 33 20 18 12 17 10 9 6 32 5 16 3 8 4 2 1 0].

10. The transmit node of claim 7 wherein N is a code length of 128, and the information sequence $S_N$ is:

$S_{128}$=[127 126 125 123 119 111 124 95 122 121 118 63 117 110 115 109 94 107 120 93 103 91 62 116 114 61 87 108 113 59 106 79 92 105 55 102 90 101 47 89 60 86 99 85 112 58 31 78 57 83 54 104 77 53 100 75 46 88 51 98 45 71 84 97 30 43 29 56 76 82 81 39 52 74 27 50 73 44 23 70 49 15 96 69 42 67 41 28 38 80 26 37 72 25 35 22 48 68 21 14 40 66 19 13 65 36 11 24 7 34 33 20 18 12 64 17 10 32 9 6 5 3 16 8 4 2 1 0].

11. The transmit node of claim 7 wherein the transmit node is a radio access node in a wireless communication system.

12. The transmit node of claim 7 wherein the transmit node is a wireless communication device in a wireless communication system.

13. A non-transitory computer readable medium comprising instructions executable by at least one processor of a transmit node whereby the transmit node is operable to:

perform polar encoding of a set of K information bits to thereby generate a set of polar-encoded information bits where:

the K information bits are mapped to the first K information bit locations specified in an information sequence $S_N$, the information sequence $S_N$ being a ranked sequence of N information bit locations among a plurality of input bits for the polar encoding where N is equivalent to a code length;

a size of the information sequence $S_N$ is greater than or equal to K;

N is a code length of 64 or 128;

if N is a code length of 64, the information sequence is:

$S_{64}$=[63 62 61 59 55 47 60 31 58 57 54 53 46 51 45 30 43 56 29 39 27 52 50 23 44 49 15 42 28 41 38 26 37 25 22 35 21 14 19 13 48 11 40 7 36 24 34 20 33 18 12 17 10 9 6 5 3 32 16 8 4 2 1 0]; or $S_{64}$=[63 62 61 59 55 47 60 31 58 57 54 53 46 51 45 30 43 56 29 39 27 52 23 50 15 49 44 42 28 41 38 26 37 25 22 35 48 21 14 19 40 13 36 11 24 34 7 33 20 18 12 17 10 9 6 32 5 16 3 8 4 2 1 0]; and if N is a code length of 128, the information sequence is:

the information sequence is $S_{128}$=[127 126 125 123 119 111 124 95 122 121 118 63 117 110 115 109 94 107 120 93 103 91 62 116 114 61 87 108 113 59 106 79 92 105 55 102 90 101 47 89 60 86 99 85 112 58 31 78 57 83 54 104 77 53 100 75 46 88 51 98 45 71 84 97 30 43 29 56 76 82 81 39 52 74 27 50 73 44 23 70 49 15 96 69 42 67 41 28 38 80 26 37 72 25 35 22 48 68 21 14 40 66 19 13 65 36 11 24 7 34 33 20 18 12 64 17 10 32 9 6 5 3 16 8 4 2 1 0]; and transmit the set of polar-encoded information bits.

* * * * *